(12) United States Patent
Xia et al.

(10) Patent No.: US 9,082,466 B2
(45) Date of Patent: Jul. 14, 2015

(54) APPARATUSES AND METHODS FOR ADJUSTING DEACTIVATION VOLTAGES

(71) Applicant: Micron Technology, Inc., Boise, ID (US)

(72) Inventors: Zhong-Yi Xia, Boise, ID (US); Vikram K. Bollu, Boise, ID (US); Jonathan L. Gossi, Boise, ID (US); Howard C. Kirsch, Eagle, ID (US); Todd A. Merritt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 21 days.

(21) Appl. No.: 13/949,006

(22) Filed: Jul. 23, 2013

(65) Prior Publication Data

US 2015/0029804 A1    Jan. 29, 2015

(51) Int. Cl.

| G11C 5/14 | (2006.01) |
|---|---|
| G11C 8/08 | (2006.01) |
| G11C 16/26 | (2006.01) |
| G11C 11/16 | (2006.01) |
| G11C 11/4091 | (2006.01) |

(52) U.S. Cl.
CPC ........ *G11C 8/08* (2013.01); *G11C 11/16* (2013.01); *G11C 11/4091* (2013.01); *G11C 16/26* (2013.01)

(58) Field of Classification Search
CPC .............. G11C 11/16; G11C 11/4091; G11C 11/5642; G11C 16/26; G11C 16/5642; G11C 13/0038
USPC ............ 365/189.09, 185.23, 185.24, 185.25, 365/226, 230.06, 145, 149, 203, 222
See application file for complete search history.

(56) References Cited

U.S. PATENT DOCUMENTS

| 7,113,304 | B2 * | 9/2006 | Iida .............................. 358/1.15 |
| 7,193,880 | B2 * | 3/2007 | Madan et al. ................. 365/145 |
| 7,489,559 | B2 * | 2/2009 | Dray et al. ............... 365/185.25 |
| 7,561,458 | B2 * | 7/2009 | Madan .......................... 365/145 |

* cited by examiner

*Primary Examiner* — Gene Auduong
(74) *Attorney, Agent, or Firm* — Dorsey & Whitney LLP

(57) ABSTRACT

Apparatuses and methods for adjusting deactivation voltages are described herein. An example apparatus may include a voltage control circuit. The voltage control circuit may be configured to receive an address and to adjust a deactivation voltage of an access line associated with a target group of memory cells from a first voltage to a second voltage based, at least in part, on the address. In some examples, the first voltage may be lower than the second voltage.

24 Claims, 5 Drawing Sheets

APPARATUSES AND METHODS FOR ADJUSTING DEACTIVATION VOLTAGES

TECHNICAL FIELD

Embodiments of the present invention relate generally to memory, and more specifically, in one or more described embodiments, to adjusting voltage deactivating voltage.

BACKGROUND

In current memory systems, data stored in volatile memories (e.g., DRAM) must be periodically refreshed to compensate for inherent leakage of capacitors in memory cells. In essence, refreshing includes, for example, reading data out of each row of memory and subsequently writing the data back to the same respective row. As a result, the original charge level on each capacitor is restored and data preserved.

While many approaches for using memory refreshes to compensate for leakage are well known in the art, these approaches have struggled when applied to the increasingly demanding operating speeds and applications of memories today. For example, in some instances, a particular row or rows of memory may be repeatedly accessed. Data stored by rows physically adjacent the repeatedly accessed row of memory may be degraded due to leakage resulting from the repeated access.

Accessing a row in this manner may include switching between providing an activation voltage and a deactivation voltage to a word line associated with a row to activate and deactivate the row, respectively. The more negative the deactivation voltage, the greater the leakage incurred during repeated accesses. While some approaches attempt to address this problem by decreasing the voltage swing to reduce leakage, these approaches have resulted in increased leakage in other aspects, such as in access devices connected to the word line associated with the accessed row.

DETAILED DESCRIPTION

Apparatuses and methods for adjusting deactivation voltages are described herein. Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Embodiments described herein are directed generally to memory operations (e.g., read operations, write operations, refresh operations). During a memory operation, an address associated with a command (e.g., read command, write command) is provided and in response a group of memory cells (hereinafter referred to by example as a "target row"), is accessed such that data may be written to, read from, or refreshed in the group of memory cells (e.g. a row or column of memory cells) corresponding to the address. By way of example, a memory operation may include decoding an address to identify a target row. Once identified, an access line (hereinafter referred to by example as a "word line") associated with a target row may be activated by providing the word line associated with the target row with an activation voltage (e.g., a high logic level voltage). As a result, memory cells of the target row may be coupled to respective bit lines and/or sense amplifiers in accordance with the memory operation. The target row may be deactivated by providing the word line associated with the target row with a deactivation voltage (e.g., a low logic level voltage) to complete the memory operation.

Figure 1:
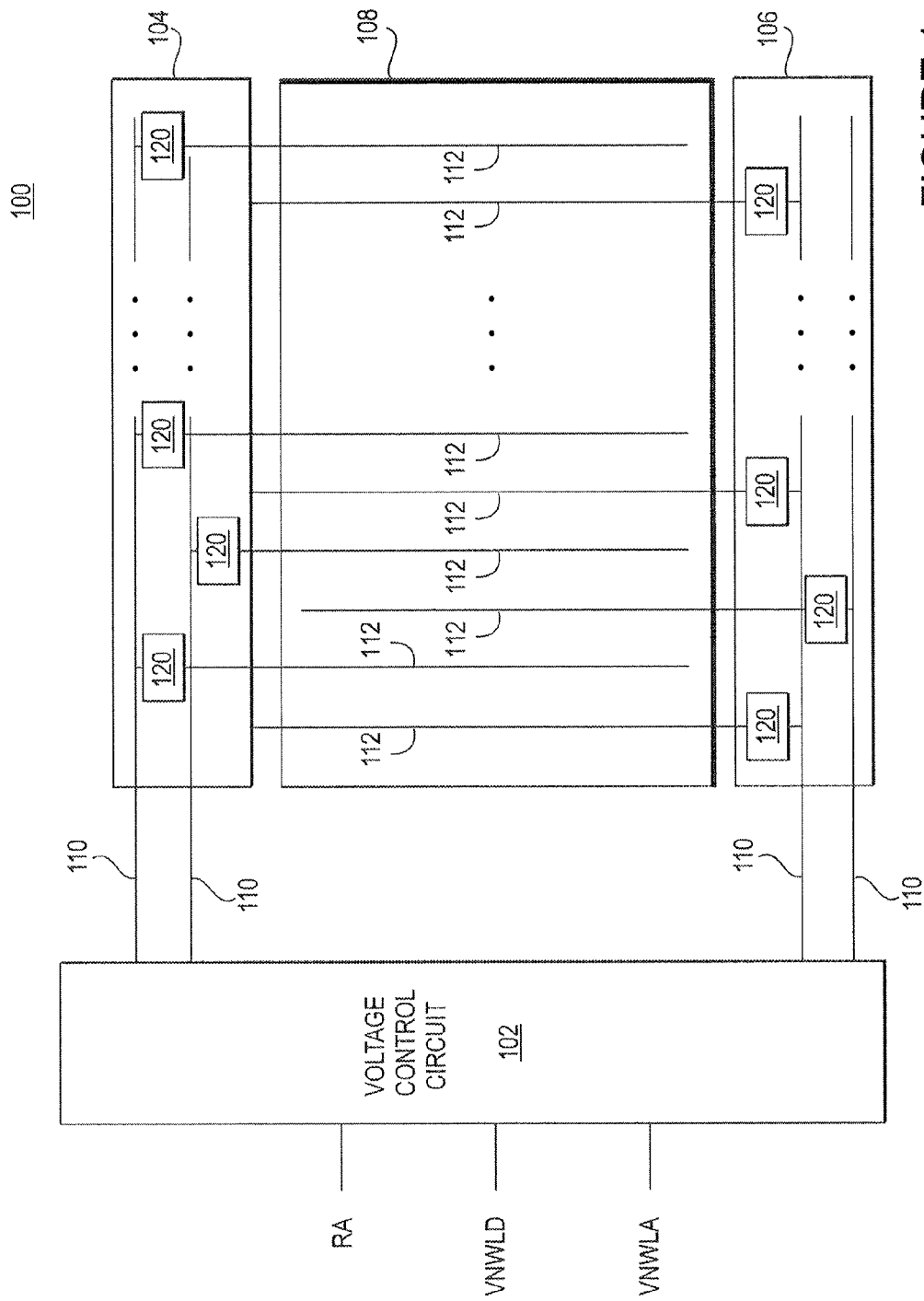
FIG. 1 is a block diagram of an apparatus according to an embodiment of the present invention.

FIG. 1 is a block diagram of an apparatus 100 according to an embodiment of the present invention. The apparatus 100 may include a voltage control circuit 102, word line driver circuits 104 and 106, and an array 108. As used herein, apparatus may refer to, for example, an integrated circuit, a memory device, a memory system, an electronic device or system, a smart phone, a tablet, a computer, a server, etc.

The voltage control circuit 102 may be configured to receive a row address RA and further may receive voltages VNWLD and VNWLA. The row address RA may be provided by a row decoder and the voltages VNWLD and VNWLA may be provided by a power supply (not shown in FIG. 1). In other examples, the voltage control circuit 102 may be configured to generate one or more of the voltages VNWLD and WNWLA.

The voltage control circuit 102 may be coupled to a plurality of busses 110, and may be configured to selectively provide the voltage VNWLD or the voltage VNWLA to each of the busses 110. In at least one embodiment, the voltage control circuit 102 may be configured to selectively provide the voltage VNWLD or the voltage VNWLA to each of the busses 110 based on the address RA.

The word lines driver circuits 104 and 106 may each include a plurality of word line drivers 120. Each word line driver 120 may be coupled to a bus 110 and further may be coupled to a respective word line 112 of the array 108. Each word line driver 120 may be configured to activate a row, for instance, by providing an activation voltage to a respective word line 112 associated with the row, and further be configured to deactivate a row, for instance, by providing a deactivation voltage to a respective word line 112. In some examples, providing an activation voltage to a word line 112 or providing a deactivation voltage to a word line 112 may include coupling the word line 112 to a bus, such as a bus 110.

In at least one embodiment, word line drivers 120 coupled to physically adjacent word lines 112 may each be associated with a respective bus 110. That is, any two physically adjacent word lines 112 may not be coupled to word line drivers 120 coupled to a same bus 110. For example, in some examples, the apparatus 100 may include four busses 110, wherein two of the busses 110 are coupled to word line drivers 120 of the word line driver circuit 104 and two of the busses 110 are coupled to word line drivers 120 of the word line driver circuit 106. Within each word line driver circuit 104, 106, word line drivers 120 may alternate in their coupling to the two respective busses 110. By way of example, a first word line driver 120 may be coupled to a first bus 110, a second word line driver 120 may be coupled to a second bus 110, a third word line driver 120 may be coupled to the first bus 110, and so on. In other examples, a different number of busses 110 (e.g., 8, 16, 32) may be included in the apparatus 100. For example, 4 busses 110 may be coupled to word line drivers 120 of the word line driver circuit 104 and 4 busses 110 may be coupled to word line drivers 120 of the word line driver circuit 106. In this manner, word line drivers 120 of each word line driver circuit 104, 106 may alternate in their coupling to four respective busses 110.

As will be described in more detail below, voltages provided to each bus 110 (e.g., VNWLD, VNWLA) may be deactivation voltages provided to one or more word lines 112. By ensuring that no physically adjacent word lines 112 are coupled to word line drivers 120 coupled to a same bus 110, a deactivation voltage of a word line 112 (e.g., a word line associated with a target row) may be selectively adjusted without adjusting the deactivation voltage of one or more word lines 112 physically adjacent the word line associated with the target row. By way of example, in at least one embodiment, the deactivation voltage of a word line 112 associated with a target row may be adjusted such that the deactivation voltage is not as low as the deactivation voltage of the word lines 112 associated with the rows physically adjacent the target row. In some embodiments, the deactivation voltage of the word line 112 associated with the target row may be a negative voltage, and the deactivation voltage of the word lines 112 associated with the physically adjacent rows may be a more negative voltage. For example, the deactivation voltage of the word line 112 associated with the target row may be approximately 0 volts and the deactivation voltage of the word lines 112 associated with the physically adjacent rows may be approximately −172 millivolts.

In this manner, the voltage swing from an activation voltage to a deactivation voltage for the word line 112 associated with the target row may be decreased while deactivation voltages for the word lines 112 associated with the physically adjacent rows are maintained at a lower voltage. Accordingly, data degradation for the memory cells coupled to the word lines 112 associated with the physically adjacent rows may be reduced. In some examples, by using a less negative deactivation voltage for a word line 112 associated with a target row during repeated memory operations, such as refresh operations, memory cell leakage of rows physically adjacent the target row may be reduced. Moreover, by maintaining the lower deactivation voltage for word lines 112 associated with the physically adjacent rows, current leakage from access devices may also be reduced.

Figure 2:
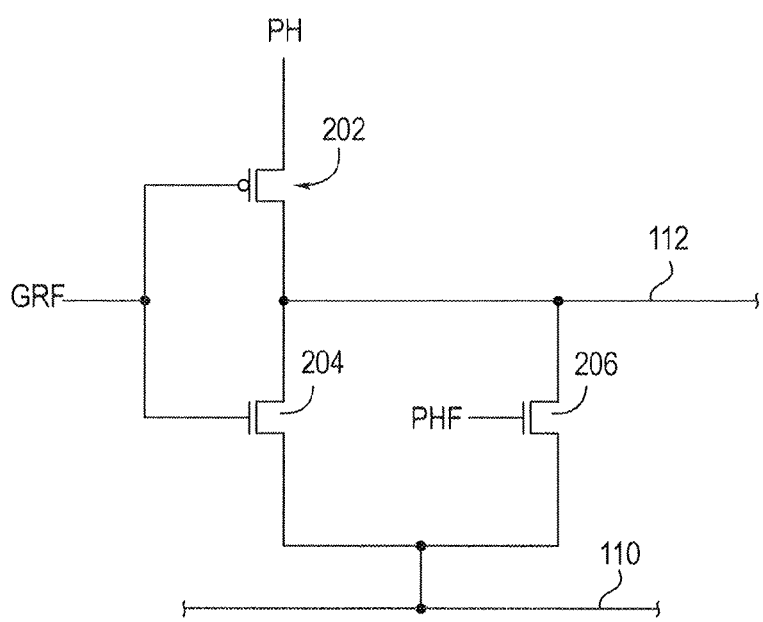
FIG. 2 is a schematic diagram of a row driver according to an embodiment of the present invention.

FIG. 2 is a schematic diagram of a word line driver 200 according to an embodiment of the present invention. The word line driver 200 may be used to implement one or more of the word line drivers 120 of FIG. 1. The word line driver 200 may include elements that have been previously described with respect to the apparatus 100 of FIG. 1. Those elements have been identified in FIG. 2 using the same reference numbers used in FIG. 1 and operation of the common elements is as previously described. Consequently, a detailed description of the operation of these elements will not be repeated in the interest of brevity.

The word line driver 200 may include transistors 202, 204, and 206. The transistors 202 and 204 may represent an inverter configured to receive a control signal PH and coupled to bus 110. The transistors 202 and 204 may be enabled responsive to a control signal GRF. The transistor 206 may be coupled between the word line 112 and the bus 110, and may be enabled responsive to a control signal PHF. The control signal PHF may be complementary to the control signal PH.

As described, as part of a memory operation, a word line associated with a target row may be provided with an activation voltage (e.g., a supply voltage VCC). During a memory operation, the control signal PH has a high logic level, which may be at the activation voltage, and the control signal GRF has a low logic level. In response, the word line 112 may be provided (e.g., driven) with an activation voltage, for instance, by providing the word line 112 with the activation voltage of the control signal PH. The control signal PHF, which is complementary to the control signal PH, may have a low logic level, thereby disabling the transistor 206. When access of the row is complete, the control signal GRF may have a high logic level, and the control signal PHF may have a high logic level. Accordingly, the word line 112 may be provided with a deactivation voltage (e.g., VNWLA, VNWLD), for instance, by coupling the word line 112 to the bus 110. In some examples, a deactivation voltage may comprise ground or may comprise a negative voltage.

Figure 3:
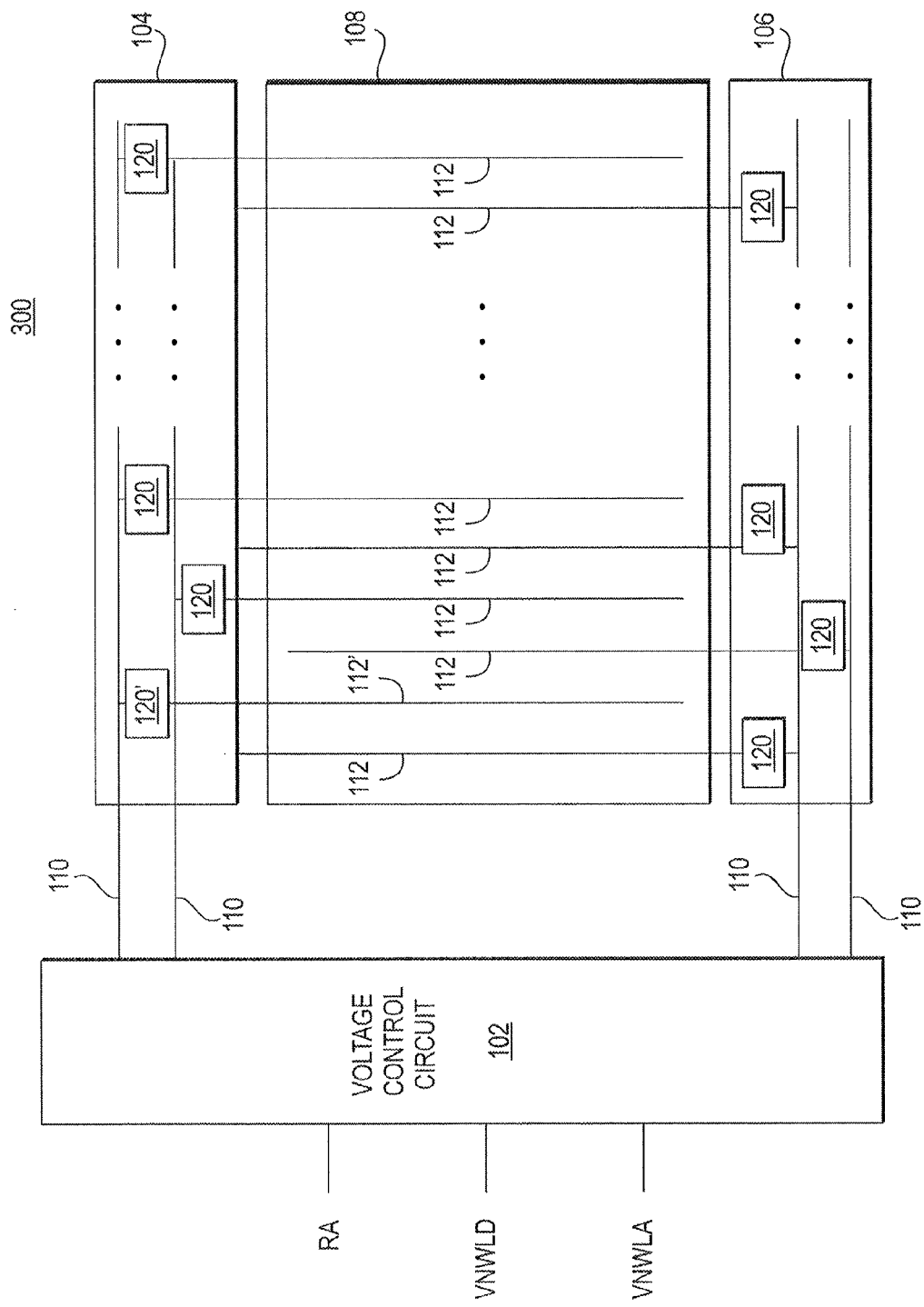
FIG. 3 is a block diagram of an apparatus according to an embodiment of the present invention.

FIG. 3 is a block diagram of an apparatus 300 according to an embodiment of the present invention. The apparatus 300 may comprise the apparatus 100 of FIG. 1. A word line 112 of the apparatus 300 may be designated as a word line 112' and a word line driver 120 may be designated as a word line driver 120'. Operation of the apparatus 300 will be described with reference to the word line 112' and the word line driver 120'. The word line 112' may be associated with a target row, and the word line driver 120' may be coupled to the word line 112'. It will be appreciated that operation described herein may apply to any word line 112 and/or word line driver 120 of the apparatus 300 and that operation described with respect to the word line 112' and word line driver 120' is provided by way of example. It will further be appreciated that in some examples described operation of the apparatus 300 may apply to operation of the apparatus 100 as well.

In an example operation of the apparatus 300, the voltage control circuit 102 may provide the supply voltage VNWLD to each of the busses 110. As part of a memory operation, the voltage control circuit 102 may identify a target row based, at least in part, on the row address RA. The word line driver 120' may be caused to activate the word line 112' associated with the target row by providing the word line 112' with an activation voltage (e.g., supply voltage VCC). The voltage control circuit 102 may further identify the bus 110 with which the word line 112' is associated.

While the word line 112' is activated, the voltage control circuit 102 may adjust the deactivation voltage of the word line 112'. For example, the voltage control circuit 102 may provide the voltage VNWLA to the bus 110 associated with the word line 112' instead of the voltage VNWLD. The voltage control circuit 102 may continue to provide the voltage VNWLD to the remaining busses 110.

After the memory operation has been performed, the word line driver 120' may deactivate the word line 112' by providing the word line 112' with a deactivation voltage. Because the voltage control circuit 102 may provide the voltage VNWLA to the bus 110 associated with the word line 112', the word line driver 120' may provide the word line 112' with a deactivation voltage comprising the voltage VNWLA while word line drivers 120 coupled to other busses 110 may provide respective word line 112 with a deactivation voltage comprising the voltage VNWLD. In at least one embodiment, the voltage VNWLA may be less negative than the voltage VNWLD. Accordingly, the word line 112' may receive a less negative deactivation voltage than word lines 112 physically adjacent the word line 112'.

In some examples, the voltage control circuit 102 may be configured to selectively provide the voltage VNWLA to a bus 110 for a particular amount of time and provide the voltage VNWLD to the bus 110 thereafter. In other examples, the voltage control circuit 102 may be configured to selectively provide the voltage VNWLA to a bus 110 until a word line 112 associated with a different bus 110 is identified by a row address RA, at which time the voltage control circuit 102 may instead selectively provide the voltage VNWLD to the bus 110 and/or the voltage VNWLA to the different bus 110.

As described, by adjusting the deactivation voltage provided to a word line associated with a target row to a less negative voltage while providing deactivation voltages to the word lines associated with physically adjacent rows with a more negative voltage, leakage may be reduced. For example, providing the word line associated with a target row with a less negative deactivation voltage may decrease memory cell charge leakage of physically adjacent word lines that may otherwise occur during repeated memory operations (e.g., read operations, write operations, refresh operations, etc.) performed on the row, and providing the physically adjacent rows with a more negative deactivation voltage may reduce access device leakage.

While operation has been described herein with respect to adjusting the deactivation voltage provided to a word line associated with a target row, it will be appreciated that adjusting the deactivation voltage by providing the voltage VNWLA may result in adjusting the deactivation voltage for all word lines associated with a same bus 110. In some examples, additional selection circuitry (not shown) may be implemented such that only the deactivation voltage of a word line associated with a target row is adjusted.

As described, in some examples, all busses 110 may be held at the voltage VNWLD until a word line associated with a target row is activated, at which time the voltage control circuit 102 may provide the voltage VNWLA to a bus 110 to adjust the deactivation voltage of the word line associated with the target row. In other examples, the busses 110 may be held at the voltage VNWLA and during activation of a word line associated with a target row, word lines physically adjacent the word line associated with the target row may be provided with the voltage VNWLD. Accordingly, the deactivation voltage of the physically adjacent word lines may be adjusted to be more negative than the deactivation voltage of the word line associated with the target row.

Figure 4:
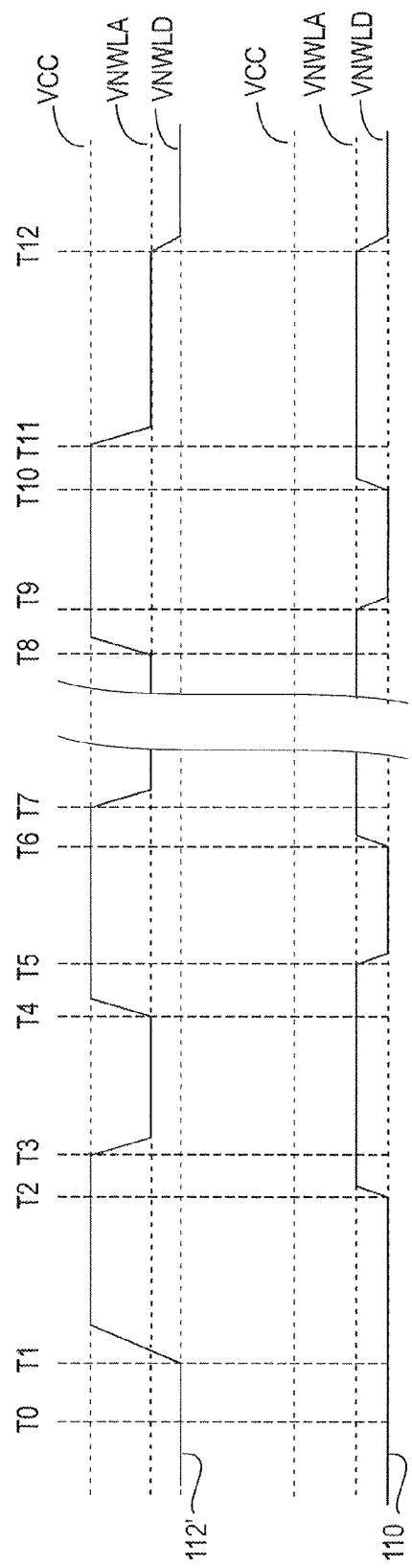
FIG. 4 is a timing diagram for operation of an apparatus according to an embodiment of the present invention.

FIG. 4 is a timing diagram 400 for operation of the apparatus 300 of FIG. 3 according to an embodiment of the present invention. The timing diagram 400 may include voltage levels of the word line 112' and the bus 110 associated with the word line 112'.

At time T0, the voltage control circuit 102 may provide the voltage VNWLD to each of the busses 110. At time T1, in response to a memory operation, the word line driver 120' may activate the word line 112' by providing an activation voltage to the word line 112'. As described, activating the word line 112' in this manner may include providing an activation voltage, such as VCC, to the word line 112'.

At time T2, in response to a row address RA, the voltage control circuit 102 may adjust the deactivation voltage provided to the word line 112'. For example, the voltage control circuit 102 may provide the voltage VNWLA to the bus 110 associated with the word line 112'. The voltage control circuit may provide the voltage VNWLD to the other busses 110, as described. At time T3, the memory operation may be completed, and the word line driver 120' may provide a deactivation voltage comprising the voltage VNWLA to the word line 112'. At time T4, in response to a subsequent memory operation directed to the word line 112', the word line 112' may again be activated.

As described, the voltage control circuit 102 may provide the voltage VNWLA to a bus 110 only for a particular amount of time before providing the voltage VNWLD. Accordingly, at time T5, the voltage control circuit may provide the voltage VNWLD to the bus 110 to adjust the deactivation voltage of the word line 112' to a more negative voltage.

At time T6, in response to a row address RA associated with the subsequent memory operation, the voltage control circuit 102 may adjust the deactivation voltage of the word line 112' by providing the voltage VNWLA to the bus 110. At time T7, the memory operation may be completed, and the word line driver 120' may provide the word line 112' with a deactivation voltage comprising the voltage VNWLA.

In this manner, during repeated memory operations performed on the word line 112', for instance, during repeated read operations, the deactivation voltage of the word line 112' may be adjusted such that deactivation of the word line 112' results in the voltage of the word line 112' transitioning to a less negative deactivation voltage than the deactivation voltage of word lines physically adjacent the word line 112' and subsequently transitioning to the more negative deactivation voltage after a period of time has elapsed.

At time T8 the word line 112' may be driven with an activation voltage, at time T9 the voltage control circuit 102 may provide the voltage VNWLD to a bus 110, at time T10 the voltage control circuit 102 may provide the voltage VNWLA to the bus 110, and at time T11 the word line driver 120' may provide the word line 112' with a deactivation voltage comprising the voltage VNWLA, as described.

Assuming that no further subsequent memory operations are performed, at time T12, the voltage control circuit 102 may provide the voltage VNWLD to the bus 110 and thereby adjust the deactivation voltage of the word line 112'. As a result the word line 112' may be provided with the voltage VNWLD.

Figure 5:
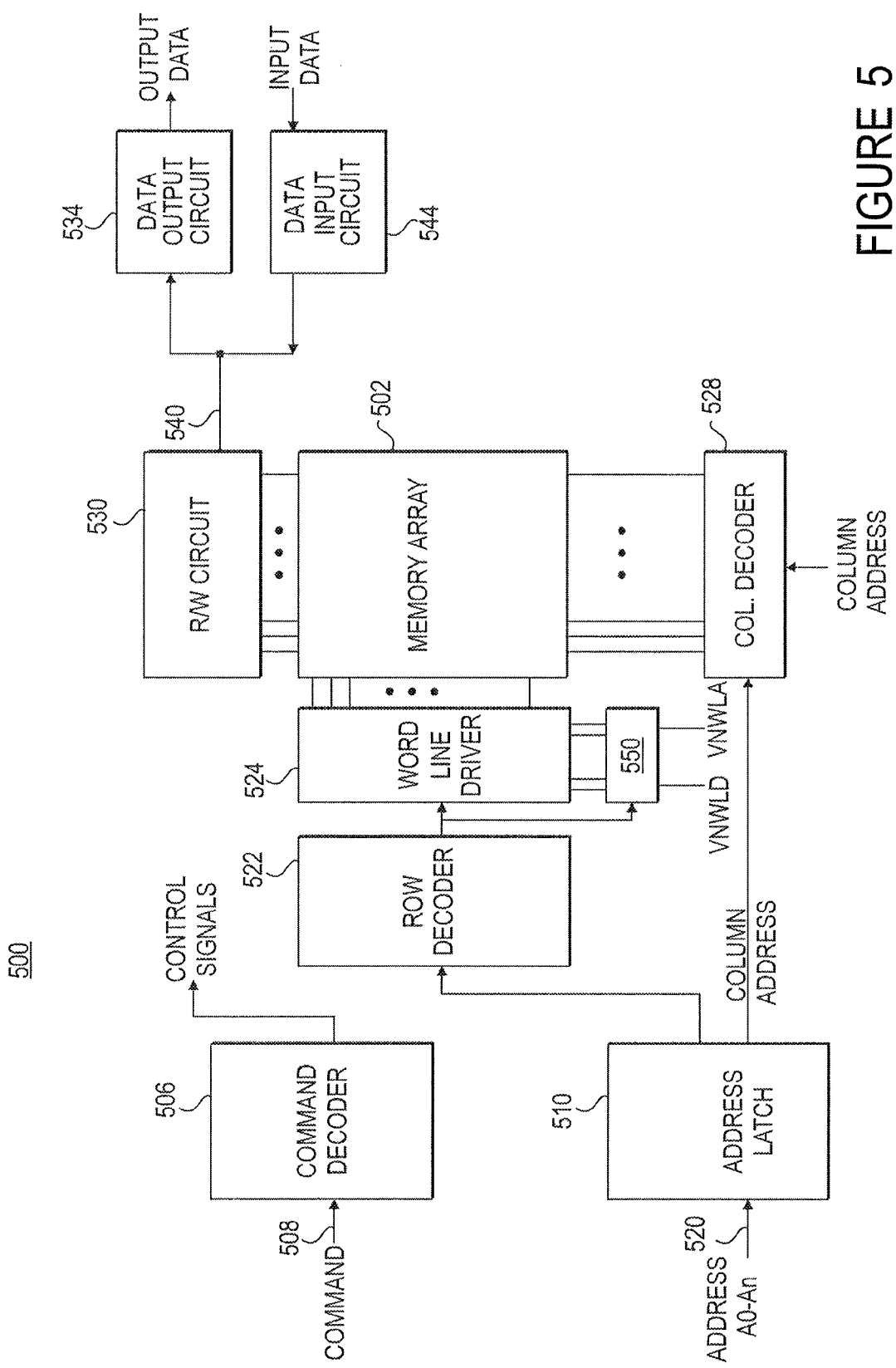
FIG. 5 is a block diagram of a portion of a memory including an apparatus according to an embodiment of the present invention.

FIG. 5 is a block diagram of a portion of a memory 500 including an apparatus according to an embodiment of the present invention. The memory 500 includes an array 502 of memory cells, which may be, for example, volatile memory cells, non-volatile memory cells, DRAM memory cells, SRAM memory cells, flash memory cells, or other types of memory cells. The memory 500 includes a command decoder 506 that receives memory commands and addresses through an ADDR/CMD bus. The command decoder 506 provides control signals, based on the commands received through the command bus 508. The command decoder 506 also provides row and column addresses to the memory 500 through an address bus 520 and an address latch 510. The address latch then outputs separate column addresses and separate row addresses.

The row and column addresses are provided by the address latch 510 to a row decoder 522 and a column decoder 528, respectively. The row decoder may, for instance, be configured to provide a row address based on a row address received from the address latch 510. The column decoder 508 selects bit lines extending through the array 502 corresponding to respective column addresses. The row decoder 510 may be coupled to word line driver 524 that activates respective word lines of memory cells in the array 502 corresponding to received row addresses. The row decoder 522 may further be coupled to an apparatus 550 that may comprise any apparatus described herein, such as the apparatus 100 of FIG. 1. The selected data line (e.g., a bit line or bit lines) corresponding to a received column address is coupled to a read/write circuitry 530 to provide read data to a data output circuit 534 via an input-output data bus 540. Write data are provided to the array 502 through a data input circuit 544 and the memory array read/write circuitry 530. The command decoder 506 responds to memory commands and addresses provided to the command bus to perform various operations on the array 502. In particular, the command decoder 506 is used to provide control signals to read data from and write data to the array 502.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
   a voltage control circuit configured to receive an address associate target group of memory cells, the voltage control circuit further configured to, during an access of the target group of memory cells;
   provide an activation voltage to a first access line that is associated with the address to activate the target group of memory cells;
   provide a first deactivation voltage to the first access line after the target group of memory cell is activated, wherein the deactivation voltage is less than the activation voltage; and
   provide a second deactivation voltage to a second access line that is physically adjacent to the first access line and coupled to another group of memory cells, wherein the first deactivation voltage is greater than the second deactivation voltage.

2. The apparatus of claim 1, wherein the voltage control circuit is further configured to provide the second deactivation voltage to the first access line a period of time after provision of the first deactivation voltage to the access line.

3. The apparatus of claim 1, wherein the voltage control first deactivation voltage control circuit is further configured to provide the first deactivation voltage to a bus while the first access line is activated.

4. The apparatus of claim 1, wherein the first access line, the second access line, and a third access line physically adjacent the first access line are each coupled to respective drivers, each of the respective drivers coupled to the voltage control circuit by a separate bus.

5. The apparatus of claim 1, wherein the voltage control circuit is configured to provide the first deactivation voltage during a refresh operation.

6. The apparatus of claim 1, wherein the apparatus is included in a memory.

7. The apparatus of claim 1, wherein the access line comprises a word line.

8. The apparatus of claim 1, wherein the group of memory cells comprises a row of memory cells.

9. An apparatus, comprising:
   a first access line associated with a target group of memory cells;
   a second access line associated with another group of memory cells;
   a voltage control circuit coupled to a first driver and a second driver, the voltage control circuit configured to provide a first deactivation voltage to the first driver to deactivate the target group of memory cells and to provide a second deactivation voltage to the second driver to deactivate the another group of memory cells, wherein the second deactivation voltage is lower than the first deactivation voltage.

10. The apparatus of claim 9, wherein at least one of the first driver or the second driver comprises an inverter pair.

11. The apparatus of claim 9, wherein the first driver is coupled to the voltage control circuit by a first bus and the second driver is coupled to the voltage control circuit by a second bus.

12. The apparatus of claim 9, wherein the voltage control circuit is further configured to provide the second deactivation voltage to the first driver after providing the first deactivation voltage to the first driver for a period of time.

13. The apparatus of claim 9, wherein the second access line is physically adjacent the first access line.

14. The apparatus of claim 9, wherein the voltage control circuit is further configured to generate the first and second deactivation voltages.

15. The apparatus of claim 9, wherein the group of memory cells comprises a row of memory cells.

16. An apparatus, comprising:
   a first plurality of drivers coupled to a first plurality of access lines respectively;
   a second plurality of drivers coupled to a second plurality of access lines respectively;
   a voltage control circuit coupled to the first plurality of drivers by a first bus and coupled to the second plurality of drivers by a second bus, the voltage control circuit configured to provide a first deactivation voltage to the first plurality of drivers to deactivate memory cells coupled to the first plurality of access lines and second plurality of drivers to deactivate memory cells coupled to the second plurality of access lines, the voltage control circuit further configured to provide a second deactivation voltage based, at least in part, on an address associated with an access line of the first plurality of access lines, wherein the first deactivation voltage is lower than the second deactivation voltage.

17. The apparatus of claim 16, wherein the second plurality of access lines comprises an access line that is physically adjacent the access line of the first plurality of access lines.

18. A method, comprising:
   providing, with a driver, a first deactivation voltage to an access line coupled to a target group of memory cells for a first portion of a memory operation;
   providing, with the driver, an activation voltage to the access line for a second portion of the memory operation; to activate the target group of memory cells;
   providing, with the driver, a second deactivation voltage to the access line for a third portion of the memory operation, the first deactivation voltage lower than the second deactivation voltage; and
   providing the first deactivation voltage to at least one access line physically adjacent to the access line during the memory operation.

19. The method of claim 18, further comprising:
   after providing the second deactivation voltage to the access line, providing, with the driver, the first deactivation voltage to the access line.

20. The method of claim 19, wherein said providing, with the driver, the first deactivation voltage to the access line comprises providing, with the driver, the first deactivation voltage to the access line after providing the second deactivation voltage to the access line.

21. The method of claim 18, wherein the access line is associated with the target group of memory cells that is repeatedly accessed.

22. A method, comprising:
   during a memory operation, adjusting the deactivation voltage of a first plurality of access lines from a first voltage to a second voltage, wherein the deactivation voltage is configured to deactivate a first group of memory cells coupled to the first plurality of access lines, wherein the first voltage is less than the second voltage; and during the memory operation, maintaining the deactivation voltage of a second plurality of access lines at the first voltage, wherein the deactivation voltage is configured to deactivate a second group of memory cells coupled to the second plurality of access lines.

23. The method of claim 22, wherein the first plurality of access lines includes an access line associated with a target group of memory cells of the memory operation.

24. The method of claim 22, wherein the second plurality of access lines includes first and second access lines physically adjacent an access line associated with a target group of memory cells.

* * * * *

UNITED STATES PATENT AND TRADEMARK OFFICE
CERTIFICATE OF CORRECTION

PATENT NO. : 9,082,466 B2 Page 1 of 1
APPLICATION NO. : 13/949006
DATED : July 14, 2015
INVENTOR(S) : Zhong-Yi Xia et al.

It is certified that error appears in the above-identified patent and that said Letters Patent is hereby corrected as shown below:

In The Claims

| Column, Line | Reads | Should Read |
| --- | --- | --- |
| Col. 7, Ln 18 | "associate target group" | -- associated with a target group -- |
| Col. 7, Ln 26 | "wherein the deactivation voltage is less than the activation voltage; and" | -- wherein the first deactivation voltage is less than the activation voltage; and -- |
| Col. 7, Ln. 38 | "wherein the voltage control first deactivation voltage control circuit is further configured" | -- wherein the voltage control circuit is further configured -- |
| Col. 8, Ln. 44 | "memory operation; to activate the target group of memory cells" | -- memory operation to activate the target group of memory cells -- |

Signed and Sealed this
Fifth Day of January, 2016

Michelle K. Lee
*Director of the United States Patent and Trademark Office*